(12) United States Patent  
Nirschl et al.

(10) Patent No.: US 7,531,420 B2
(45) Date of Patent: May 12, 2009

(54) SEMICONDUCTOR MEMORY CELL AND CORRESPONDING METHOD OF PRODUCING SAME

(75) Inventors: Thomas Nirschl, Essex Junction, VT (US); Alexander Olbrich, Hohenbrunn (DE); Martin Ostermayr, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 356 days.

(21) Appl. No.: 11/493,252

(22) Filed: Jul. 26, 2006

(65) Prior Publication Data

US 2007/0034920 A1 Feb. 15, 2007

Related U.S. Application Data (63) Continuation of application No. PCT/EP2004/053733, filed on Dec. 30, 2004.

(30) Foreign Application Priority Data

Jan. 29, 2004  (DE) .................. 10 2004 004 584

(51) Int. Cl.
*H01L 21/20* (2006.01)
*H01L 21/8242* (2006.01)

(52) U.S. Cl. .................. 438/396; 438/397; 438/253; 257/E21.664; 257/E27.104

(58) Field of Classification Search ................. 438/396, 438/253, 244, 702, 397, 398; 257/295, E21.664, 257/E21.013, E21.012, E21.014, E27.104, 257/E27.016
See application file for complete search history.

(56) References Cited

U.S. PATENT DOCUMENTS

| 5,012,309 A | 4/1991 | Nakayama |
| 5,172,201 A | 12/1992 | Suizu |
| 5,317,432 A * | 5/1994 | Ino ............................. 349/39 |
| 5,444,013 A * | 8/1995 | Akram et al. ................ 438/398 |
| 5,627,094 A * | 5/1997 | Chan et al. ................... 438/253 |
| 5,644,151 A | 7/1997 | Izumi et al. |
| 5,798,545 A * | 8/1998 | Iwasa et al. ................. 257/301 |
| 6,335,552 B1 | 1/2002 | Mitani |
| 6,628,367 B2 * | 9/2003 | Hirabayashi et al. ........ 349/187 |
| 6,794,262 B2 * | 9/2004 | Ning et al. ................... 438/396 |
| 2003/0073286 A1 * | 4/2003 | Chiang et al. ............... 438/253 |
| 2004/0004891 A1 * | 1/2004 | Sommer et al. ............. 365/222 |
| 2004/0235259 A1 * | 11/2004 | Celii et al. .................. 438/396 |
| 2004/0262655 A1 * | 12/2004 | Kweon ........................ 257/295 |
| 2005/0006681 A1 * | 1/2005 | Okuno ........................ 257/295 |
| 2005/0285170 A1 * | 12/2005 | Mikawa et al. .............. 257/295 |
| 2006/0054951 A1 * | 3/2006 | Gonzalez .................... 257/295 |
| 2006/0063279 A1 * | 3/2006 | Honma et al. ................. 438/3 |
| 2007/0034920 A1 * | 2/2007 | Nirschl et al. ............... 257/295 |

FOREIGN PATENT DOCUMENTS

| DE | 197 57 490 A1 | 2/1999 |
| DE | 198 22 797 A1 | 8/1999 |
| EP | 0 337 436 | 10/1989 |
| GB | 2 331 839 A | 6/1999 |
| GB | 2 337 160 A | 11/1999 |
| JP | 62086853 | 4/1987 |

\* cited by examiner

*Primary Examiner*—Walter L Lindsay, Jr.
(74) *Attorney, Agent, or Firm*—Brinks Hofer Gilson & Lione

(57) ABSTRACT

A semiconductor memory cell and production method provides a storage capacitor connected to a selection transistor. The storage capacitor is formed as a contact hole capacitor in at least one contact hole for a source or drain region. Such a semiconductor memory cell can be produced cost-effectively and allows a high integration density.

16 Claims, 8 Drawing Sheets

SEMICONDUCTOR MEMORY CELL AND CORRESPONDING METHOD OF PRODUCING SAME

PRIORITY CLAIM

The present application is a continuation of International Application PCT/EP2004/053733, filed Dec. 30, 2004, and claims the benefit of priority of German Patent Application No. DE 10 2004 004 584.4, filed Jan. 29, 2004.

BACKGROUND

1. Technical Field

The present invention relates to a semiconductor memory cell as well as to an associated production method and, in particular, to a semiconductor memory cell having a contact hole capacitor.

2. Background Information

Future semiconductor components will have a great demand for large, high-density memory zones. The overall take-up of the available chip surface by such embedded memory zones is now already about 50% of the total chip surface, and will increase further. High-density semiconductor memory cells are therefore necessary to keep the memory zone as small as possible and reduce the overall size of the semiconductor component, so that the production costs can also be reduced. For this reason, the semiconductor industry is following a trend away from conventional 6-transistor semiconductor memory cells to 1-transistor, 2-transistor and 3-transistor (1T, 2T, 3T) semiconductor memory cells, so that a high integration density, an improved yield and a lower so-called soft error sensitivity is obtained with reduced leakage currents.

In contrast to a 6-transistor semiconductor memory cell, however, 1-transistor, 2-transistor and 3-transistor semiconductor memory cells require a capacitance or capacitor for storing charges and a refresh of the stored charges at predetermined time intervals. Since the refresh rate of embedded 1T, 2T and 3T semiconductor memory cells can be much more than that of conventional dynamic random access memories (DRAMs), it is possible to use small storage capacitors.

Figure 1:
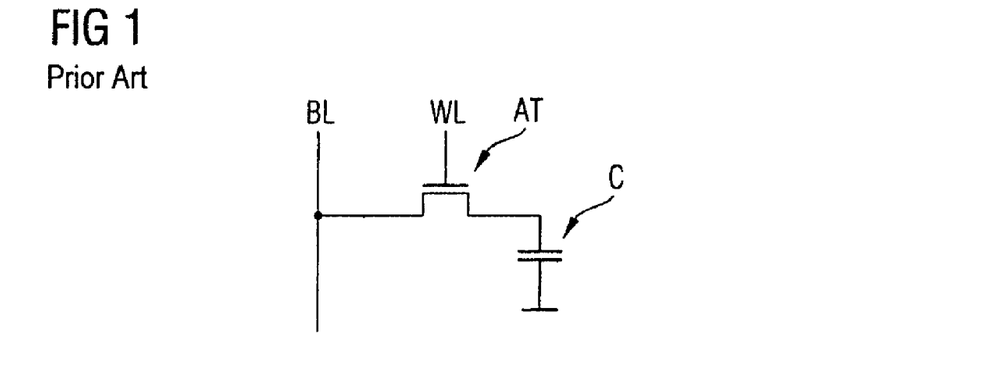
FIGS. 1-3 show simplified equivalent circuit diagrams of a 1T, 2T and 3T semiconductor memory cell according to the prior art.
Figure 2:
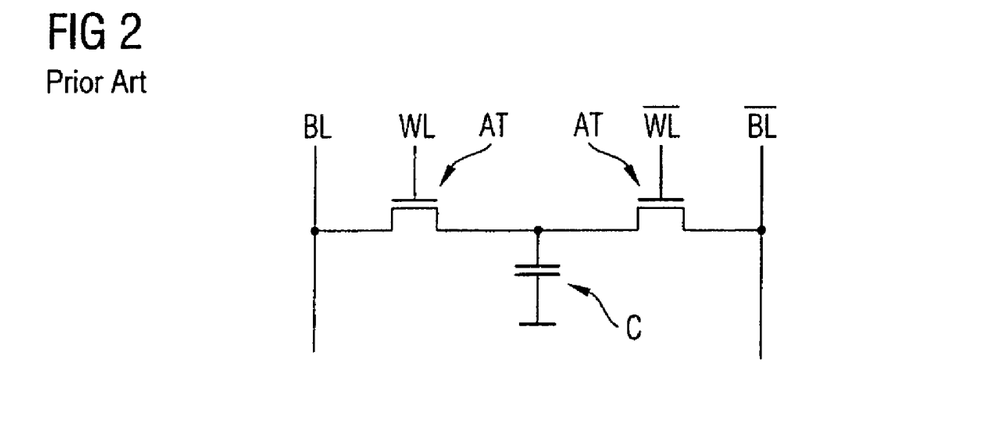
Figure 3:
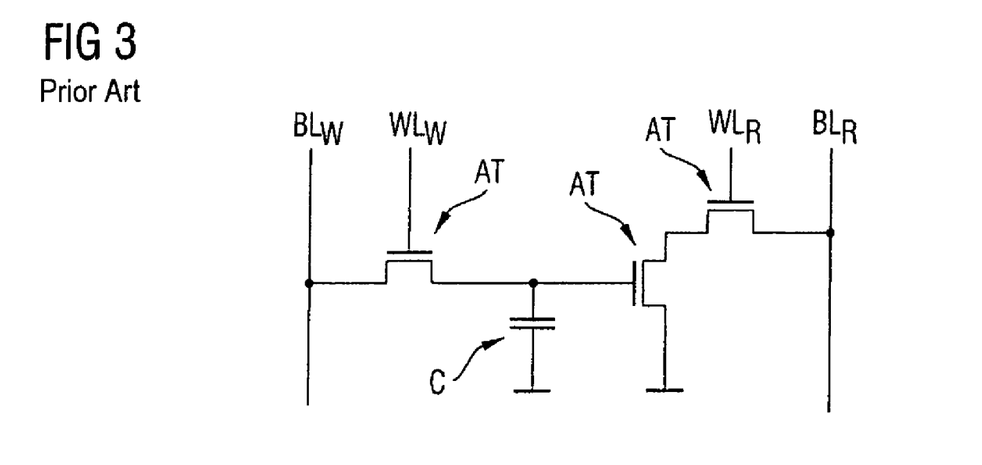

FIGS. 1 to 3 show simplified equivalent circuit diagrams respectively for a 1-transistor, 2-transistor and 3-transistor semiconductor memory cell, BL denoting a bit line, WL denoting a word line and AT denoting a respective selection transistor, via which a storage capacitor C can be driven.

According to FIG. 2, inverted word lines WL/ and inverted bit lines BL/, which drive the storage capacitor C via a further selection transistor AT, are furthermore provided in the 2-transistor semiconductor memory cell.

According to FIG. 3, the storage capacitor C in the 3-transistor semiconductor memory cell is on the one hand written to via a write bit line BLW and a write word line WLW and an associated selection transistor AT and read out via a read word line WLR and a read bit line BLR and two further associated selection transistors AT. To produce such 1T, 2T, 3T semiconductor memory cells, for example, so-called embedded DRAM semiconductor memory cells are used.

Figure 4:
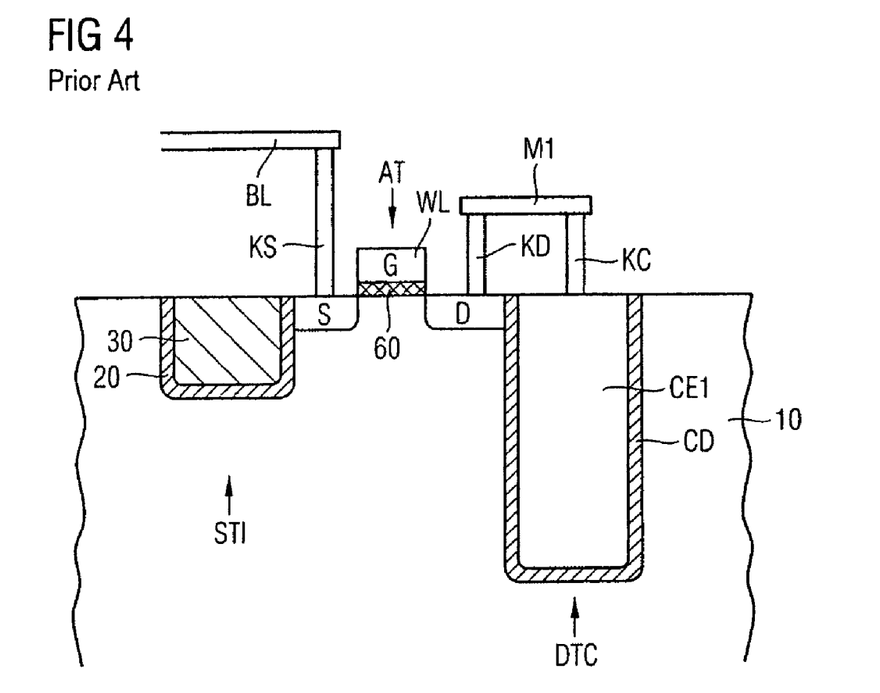
FIG. 4 shows a simplified sectional view of a 1T semiconductor memory cell with a deep trench capacitor according to the prior art.

FIG. 4 shows a simplified sectional view of such a 1-transistor semiconductor memory cell with a deep trench capacitor. According to FIG. 4 there is a deep trench for producing a deep trench capacitor DTC in a semiconductor substrate 10, a capacitor dielectric (CD) being formed on the trench surface and an electrically conductive filler layer, which together with the semiconductor substrate 10 as the other capacitor electrode produces the deep trench capacitor DTC, is formed as a capacitor counter electrode CE1 on the surface of the capacitor dielectric. Field-effect transistors with a source region S and a drain region D for establishing a channel in the semiconductor substrate 10 are conventionally used as selection transistors AT, a gate dielectric 60 being formed on the surface of the channel, and a control electrode or a gate G, which essentially produces a word line WL, being formed thereon. The source region S is connected for example via a source contact KS or a corresponding contact-via to a bit line BL which, for example, lies in a metallization plane. Similarly, the drain region D is connected for example via a first metallization plane M1, a drain contact KD and a capacitor contact KC to the deep trench capacitor DTC, or its capacitor counter electrode CE1.

Semiconductor circuits for establishing active areas AA, in particular for insulating the switching elements, for example the selection transistor AT, furthermore comprise so-called shallow trench isolations STI which, for example, have an insulating liner layer 20 and an insulation filler layer 30.

Although semiconductor memory cells with a very small space requirement can be produced with such DRAM semiconductor memory cells owing to the use of deep trench capacitors DTC, the costs are extraordinarily high in particular because of the production process for the deep trench capacitor DTC. Conventionally, 1T, 2T and 3T semiconductor memory cells are therefore currently produced with so-called MOS/MIM capacitors (MOS/MIM caps) which are substantially more cost-effective to produce.

Figure 5:
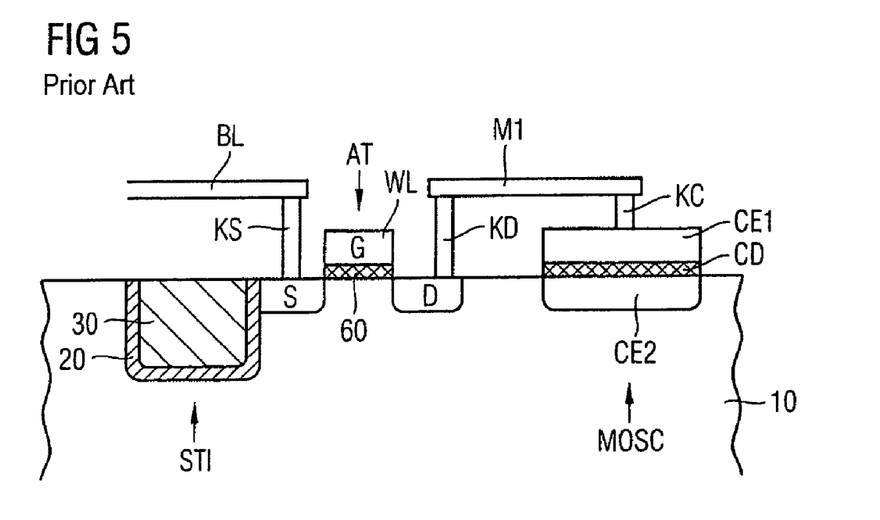
FIG. 5 shows a simplified sectional view of a 1T semiconductor memory cell with an MOS capacitor according to the prior art.

FIG. 5 shows a simplified sectional view of a 1-transistor semiconductor memory cell with such an MOS capacitor MOSC, the same reference numerals denoting identical or corresponding elements as in FIG. 1 and repeated description being omitted below. According to FIG. 5, the storage capacitor is consequently produced by an MOS capacitor MOSC, the semiconductor substrate 10 or a doping region formed therein being used as a capacitor electrode CE2, on the surface of which a capacitor dielectric CD is formed with a capacitor counter-electrode CE1 being formed thereon for example as a polycrystalline semiconductor layer. The capacitor counter electrode CE1 is in turn electrically connected via a capacitor contact KC and a drain contact KD and a preferably first metallization plane M1 to the drain region D of the selection transistor AT. Although this can substantially reduce the costs, the area requirement for such a semiconductor memory cell is greatly increased since the MOS or MIM capacitor MOSC is essentially formed on the surface of the semiconductor substrate 10 and its capacitance is therefore directly proportional to the area occupancy of the available component surface.

BRIEF SUMMARY

A semiconductor memory cell and an associated production method are provided which have reduced production costs with an increased integration density.

In particular by using a contact hole capacitor as the storage capacitor, which is formed in at least one contact hole for the source or drain region of the selection transistor, the integration density of a semiconductor memory cell can be substantially increased since the capacitor is formed in a contact hole required in any case for the selection transistor. Furthermore, the production costs can moreover be reduced since method sub-steps for forming the required contact holes can simultaneously be used for forming the contact hole capacitor.

Preferably, the at least one contact hole for the contact hole capacitor is formed in an inter-dielectric formed on the semiconductor substrate while at least partially exposing the associated source or drain region, a capacitor counter electrode being formed on the contact hole surface, although it does not reach to the surface of the inter-dielectric and is electrically conductively connected in its lower zone to the source or drain region. A capacitor dielectric, which reaches to the surface of the inter-dielectric, is furthermore formed on the surface of the capacitor counter electrode and of the upper region of the contact hole. Finally, an electrically conductive filler layer for producing a capacitor electrode inside the contact hole is formed on the surface of the capacitor dielectric. A contact hole capacitor which has a minimal space requirement and a sufficient charge capacity can thereby be provided by merely slight modifications.

Preferably, the at least one contact hole has a circularly round, oval or rectangular shape, any available mask elements of a standard process being usable.

To connect the contact hole capacitor, a capacitor connection line may furthermore be formed above the inter-dielectric. Since such connection lines conventionally lie in a metallization plane, the connection resistances can be kept minimal.

The capacitor connection line may furthermore comprise at least one auxiliary connection line section, which is formed essentially perpendicularly to the capacitor connection line above the inter-dielectric. In this way, a respective capacitance can be adjusted in a fine-grained and arbitrary fashion for an overall contact capacitor.

In particular, a multiplicity of contact hole capacitors may be formed for a respective source or drain region of a selection transistor, the at least one auxiliary connection line section connecting the multiplicity of contact hole capacitors together in parallel. Such a capacitor may also retrospectively be modified or adjusted to a desired capacitance, for example by laser beams.

A silicon oxide, silicon nitride and/or a so-called high-k material with a high relative dielectric constant is preferably used as the capacitor dielectric, so that the desired capacitances can be increased further.

In respect of the production method, a selection transistor with a source region and a drain region as well as a gate dielectric and a control electrode is formed first, and an inter-dielectric is deposited thereon. Contact holes to at least partially expose the source region and the drain region are subsequently formed in the inter-dielectric, a liner layer being formed as a capacitor counter electrode in at least one contact hole, although it does not reach to the surface of the inter-dielectric. A further dielectric layer is subsequently formed as a capacitor dielectric on the surface of the capacitor counter electrode, as far as the surface of the inter-dielectric, and an electrically conductive filler layer is formed thereon as a capacitor electrode inside the at least one contact hole for the contact hole capacitor. To connect the capacitor electrode, a capacitor connection line is subsequently formed above the inter-dielectric and the filler layer. Because several method steps can be used both for forming conventional contact holes and for forming contact hole capacitors in this production method, the production costs are greatly reduced.

In particular, by simultaneously using the conventionally provided electrically conductive liner layer both in the contact hole for the contact hole capacitor and in the contact hole for the remaining source or drain region, the method steps or layers provided in conventional contact hole methods can advantageously be used for forming a capacitor counter electrode of the contact hole capacitor.

Furthermore, the capacitor connection line as well as the associated auxiliary connection line sections can be produced simultaneously with the electrically conductive filler layer to produce the capacitor electrode, so that the production costs are further reduced.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 6A:
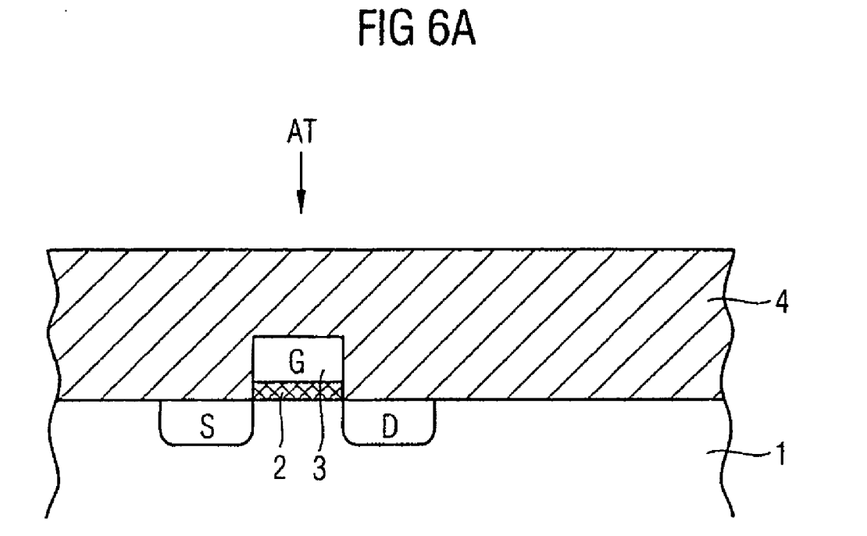
FIGS. 6A-6C show simplified sectional views to illustrate a method that produces a 1T semiconductor memory cell.
Figure 6B:
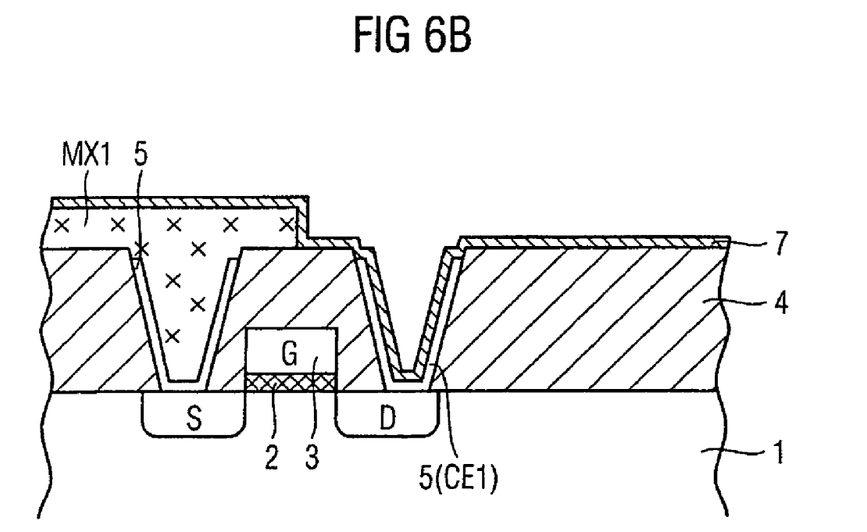
Figure 6C:
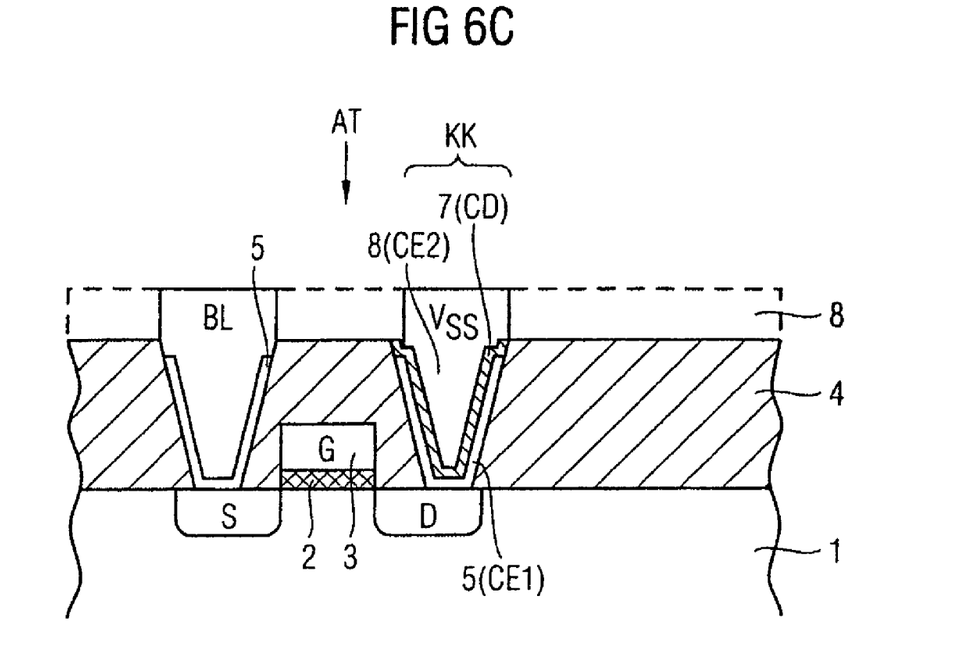

FIGS. 6A to 6C show simplified sectional views to illustrate essential method steps in the production of a 1T semiconductor memory cell according to a first exemplary embodiment, the same reference numerals denoting identical or corresponding elements as in FIGS. 1 to 5 and repeated description being omitted below.

According to FIG. 6A, a semiconductor substrate 1 is prepared first, a Si semiconductor substrate preferably being used. Shallow trench isolations STI for establishing active areas AA in the semiconductor substrate 1 may be formed and/or corresponding trench dopings may be provided (not shown).

A selection transistor AT that selects the semiconductor memory cell is subsequently formed in the semiconductor substrate 1. For example, a gate insulation layer 2 may be formed surface-wide on the surface of the semiconductor substrate 1 and a control electrode layer 3 may be formed surface-wide thereon. So-called gate stacks comprising the gate insulation layer 2 and the control electrode layer 3 are subsequently structured, for example by photolithographic methods, source regions S and drain regions D finally being formed in a self-aligning fashion in the semiconductor substrate 1 on the sides of the gate stack, for example by ion implantation. Optionally, the control electrode layer 3 or the structured control electrode G may be salicided to increase the conductivity, where a highly conductive metal-semiconductor composite is formed by using a deposited metal layer. The control electrode layer 3 preferably consists of polycrystalline semiconductor material and, in particular, polysilicon.

An inter-dielectric is subsequently formed on the surface of the semiconductor substrate 2 or of the gate stack 2 and G, borophosphosilicate glass (BPSG) preferably being applied surface-wide. The thickness of this layer already partly determines a capacitance of the future contact hole capacitor, although it has a predetermined standard thickness in the respective method.

According to FIG. 6B, the contact holes in the inter-dielectric 4 are now formed for the source region S and the drain region D, the source region S and the drain region D at least partially exposed or the semiconductor substrate 1 opened at this position. In respect of the contact holes, distinction is subsequently made between a contact hole for the contact hole capacitor KK, which is formed for example on the drain region D in the represented exemplary embodiment, and a further contact hole which is formed on the remaining source region S. The contact hole capacitor may also be formed in the contact hole for the source region S and the normal contact hole may be formed in the area of the drain region D.

These contact holes are preferably formed simultaneously by using conventional processes, in particular anisotropic etching methods and preferably a so-called RIE (reactive ion etch) method. Although the contact holes for the contact hole capacitor and for the remaining source region S are consequently formed simultaneously, it is also possible to make these recesses or indentations in different method steps from one another, for example successively.

Figure 9:
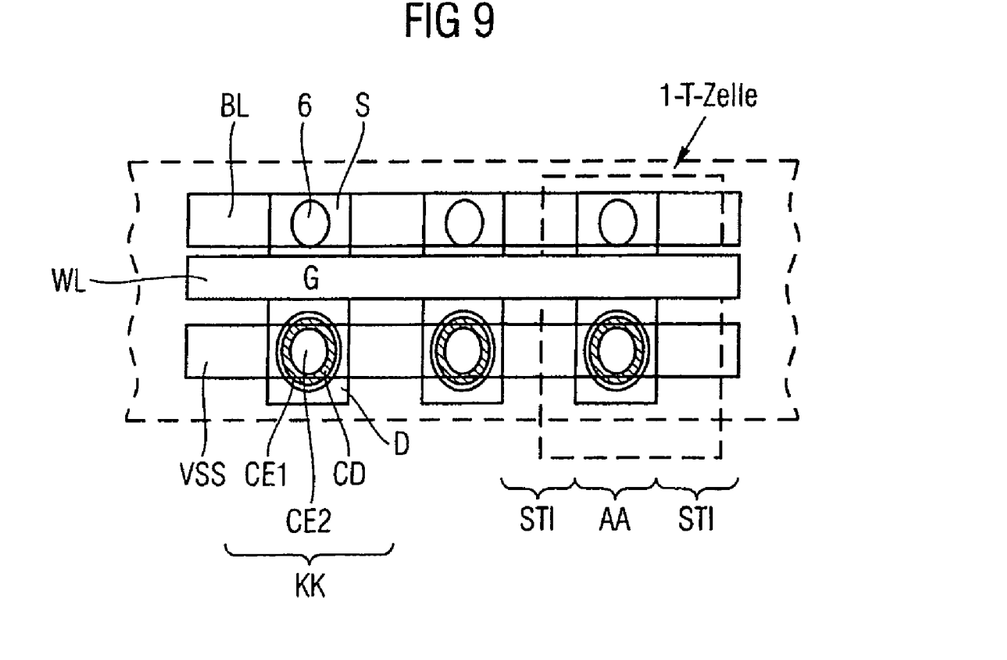
FIG. 9 shows a simplified plan view of 1T semiconductor memory cells according to FIG. 8.

FIG. 9 shows a simplified plan view to illustrate 1T semiconductor memory cells, the same reference numerals denoting identical or corresponding elements as in FIGS. 1 to 6 and repeated description being omitted below.

According to FIG. 9, contact holes of different size are preferably formed for the contact hole capacitor KK and for the remaining source region S in the inter-dielectric 4, both an increased capacitor capacitance for the contact hole capacitor and an almost equal contact resistance for the source region S and the drain region D in particular being obtained. Moreover, the filling of the contact hole with a capacitor counter electrode CE1, a capacitor dielectric CD and a capacitor electrode CE2 to produce the desired contact hole capacitor KK are thereby greatly simplified in particular.

Returning again to FIG. 6B, an electrically conductive liner layer 5 is subsequently formed as a capacitor counter-electrode CE1 at least in the contact hole for the contact hole capacitor KK or the drain region D, on its contact hole surface, i.e. on the surface of the inter-dielectric 4 and on the exposed surface of the semiconductor substrate 1 in the area of the drain region D. For insulation reasons, the liner layer 5 should not extend to the horizontal surface of the inter-dielectric 4 in the upper zone of the contact hole.

The liner layer 5 is preferably also formed simultaneously in the contact hole for the remaining source region S on its contact hole surface or on the exposed surface of the semiconductor substrate 1, since such a liner layer is conventionally provided as a standard in a production method for producing contact-vias or contact elements. The liner layer 5 is consequently formed surface-wide on a wafer surface, and preferably anisotropic back-etching is carried out to produce a desired spacing in the upper zone of the contact hole from the horizontal surface of the inter-dielectric 4.

For example, an approximately 10 nm thick titanium nitride (TiN) layer is deposited conformally, i.e. with constant layer thickness, and etched back by an RIE etching method, to obtain the aforementioned back-etching in the upper zone of the contact hole.

It may be possible to carry out an isotropic back-etching of the liner layer 5 in the lower or bottom zone of the contact hole, although this is not damaging even if the semiconductor substrate 1 or the source and drain regions S and D are intended to be exposed. The capacitor counter-electrode CE1 for the contact hole capacitor is consequently formed by this electrically conductive liner layer 5, while it is formed in the conventional contact hole for the remaining source region S essentially to improve the deposition process and to improve conductivity.

Subsequently, according to FIG. 6B, the contact hole for the remaining source region S is masked or filled with a first mask layer or first (non-critical) mask MX1, and a further dielectric layer 7 is deposited preferably surface-wide. For example, oxide and/or nitride layers with a thickness of from 3 to 15 nm and preferably so-called high-k dielectrics with a high relative dielectric constant are used as the dielectric layer 7.

According to FIG. 6C, for example, planarization is subsequently carried out as far as the surface of the inter-dielectric 4, and the first mask MX1 is removed or stripped from the contact hole for the remaining source region S. A capacitor dielectric CD which reaches to the horizontal surface of the inter-dielectric 4, and thus also reliably insulates the liner layer 5 or the capacitor counter-electrode CE1 in the upper zone of the contact hole, is thereby obtained in the area of the contact hole for the contact hole capacitor or the drain region D.

According to FIG. 6C, an electrically conductive filler layer 8 may subsequently be deposited on the surface of the inter-dielectric 4 and in the contact holes, so that the contact holes are substantially completely filled. Preferably, a tungsten layer conventionally used in contact hole methods is deposited surface-wide as the filler layer 8.

Photolithographic structuring of the electrically conductive filler layer 8 is subsequently carried out, so that it is possible to form a bit line BL connected to the source region S and a capacitor electrode CE2 inside the contact hole with an associated capacitor connection line VSS in one production step.

Instead of structuring, however, it is in principle also possible to carry out further planarization as far as the inter-dielectric 4, the bit line BL and the capacitor connection line for connecting the capacitor electrode CE2 being formed in the conventional way in a subsequent metallization step.

Figure 7A:
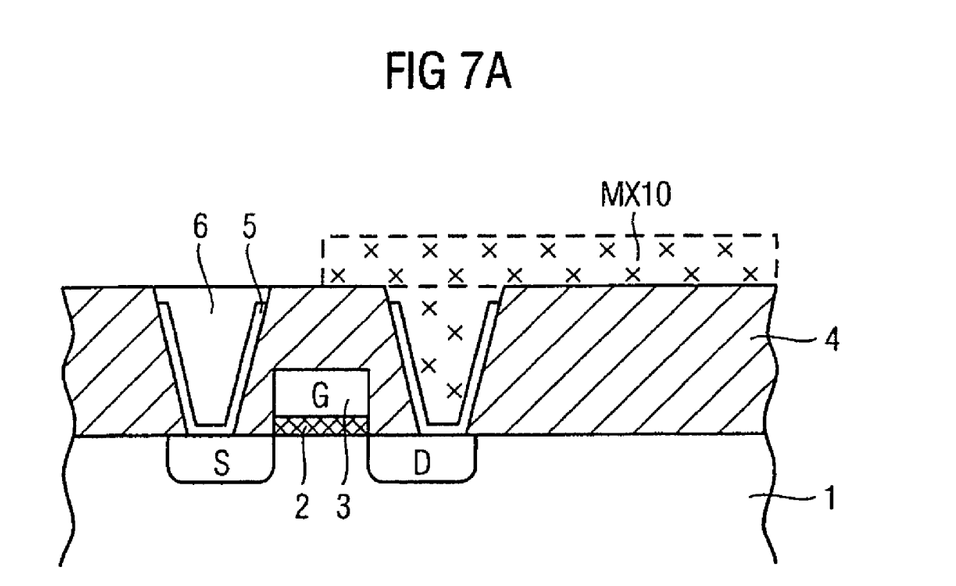
FIGS. 7A-7C show simplified sectional views to illustrate a method that produces a 1T semiconductor memory cell.
Figure 7B:
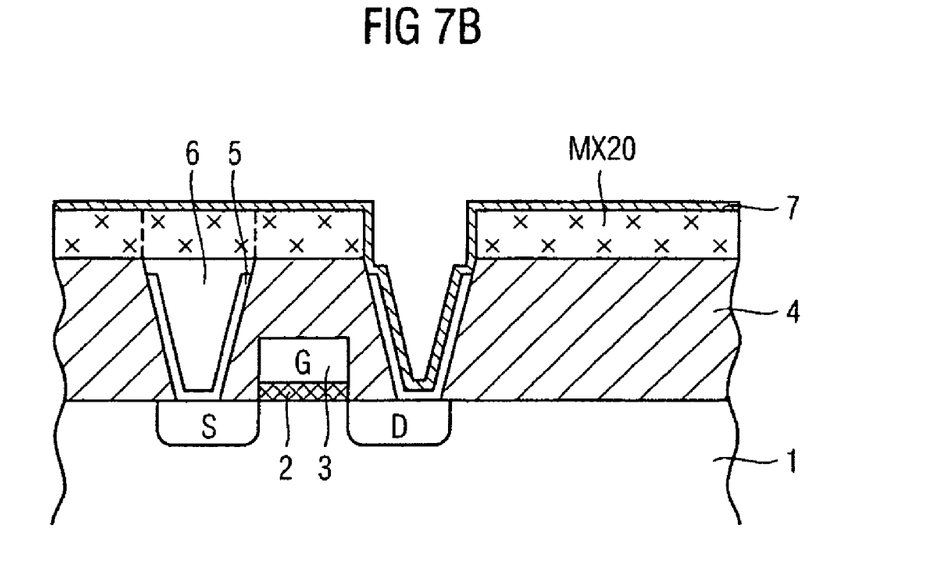
Figure 7C:
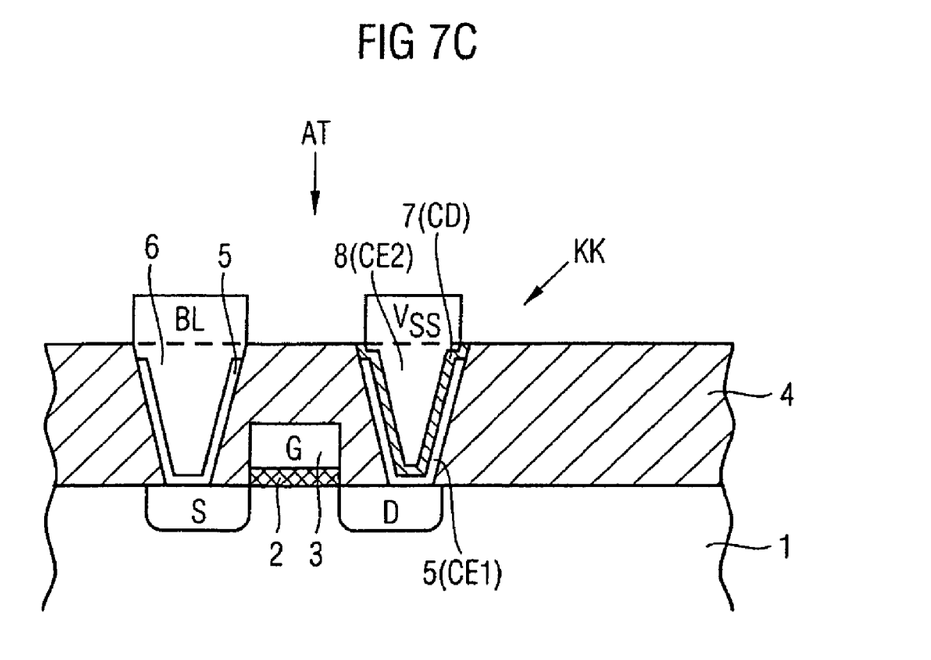

FIGS. 7A to 7C show further simplified sectional views to illustrate a process for the production of a 1-transistor semiconductor memory cell according to a second exemplary embodiment, the same reference numerals denoting identical or corresponding elements as in FIGS. 1 to 6 and repeated description being omitted below.

FIG. 7A shows a sectional view applicable, for example, after the preparatory step according to FIG. 6A as an alternative to the first exemplary embodiment.

According to this second exemplary embodiment, as in the first exemplary embodiment, the contact holes and the liner layer 5 are formed first. The contact hole for the future contact hole capacitor is subsequently covered or filled with a first (noncritical) mask MX10, and the contact hole for the remaining source region S is subsequently filled with a second electrically conductive filler layer 6 (e.g., W) to complete the contact element for the source region S. The second conductive filler layer may again be deposited surface-wide, for example, with planarization subsequently being carried out. After the planarization, the parts of the first mask MX10 remaining in the contact hole for the contact hole capacitor are also removed or stripped, and a second mask layer MX20 is formed on the surface of the inter-dielectric 4 so that only a zone of the contact hole for the contact hole capacitor or for the drain region D remains exposed. This is again subsequently followed by surface-wide deposition of the dielectric layer 7 which finally forms the capacitor dielectric CD and of a first conductive filler layer 8, for example W. Such a sectional view is represented in FIG. 7B.

According to FIG. 7C, planarization may again optionally be carried out as far as the inter-dielectric 4, a bit line BL and a capacitor connection line VSS subsequently being formed on the surface of the first conductive filler layer 8 or of the capacitor electrode and of the second conductive filler layer 6.

Preferably, however, the capacitor connection line VSS is formed integrally with the first electrically conductive filler layer 8 to produce the capacitor electrode CE2 in the contact hole for the contact hole capacitor, the bit line BL being formed in a subsequent method step. The bit line BL may furthermore be formed simultaneously with the capacitor connection line VSS and the capacitor electrode CE2 or the filler layer for the contact hole, in which case, for example, a recess for the bit line BL must also be formed at a corresponding position in the second mask layer MX20 comparably as with a Damascene method.

Figure 8:
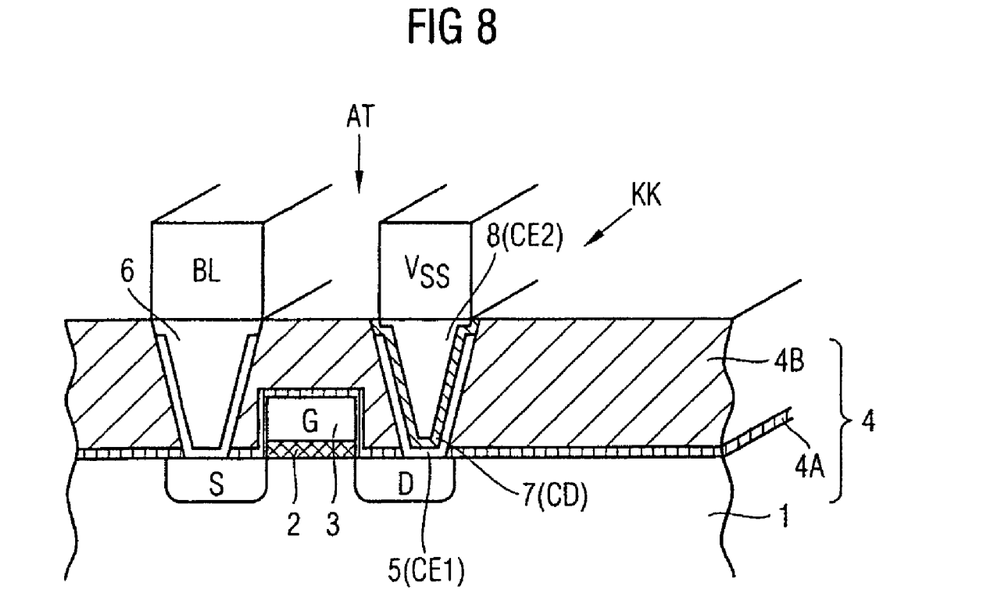
FIG. 8 shows a simplified sectional view to illustrate a 1T semiconductor memory cell.

FIG. 8 shows a simplified sectional view to illustrate a 1-transistor semiconductor memory cell according to a third exemplary embodiment, the same reference numerals denoting identical or corresponding elements as in FIGS. 1 to 7 and repeated description being omitted below.

According to FIG. 8, the inter-dielectric 4 may also comprise a multi-layer sequence, a layer sequence with a SiN layer 4A and a BPSG layer 4B being used in particular. The SiN layer 4A is used in this case as a passivation layer and lies directly on the surface of the semiconductor substrate 1 and of the structured gate stack consisting of the gate dielectric 2 and the control electrode G. Materials known from conventional contact production methods are again used for the liner layer 5 or the capacitor counter electrode CE1, an approximately 10 nm thick TiN layer being used in particular.

Silicon oxide, silicon nitride or so-called high-k dielectrics with a high relative dielectric constant are preferably used for the capacitor dielectric CD newly introduced into the production process, or the further dielectric layer 7. The thickness of this dielectric layer 7 is from 3 to 15 nm, so that a capacitance can be adjusted.

The tungsten plugs known from conventional contact methods, which allow optimal filling of the often very deep contact holes, are preferably used as filler layers 6 and 8 for the contact holes. If they are not produced integrally with the filler layers, preferably Al layers are structured in a first metallization plane for the bit line BL as well as the capacitor connection line VSS. Similarly, moreover, it is also correspondingly possible to form Cu layers or other highly conductive metal layers, for example by Damascene methods, in a first or higher metallization plane.

FIG. 9 shows a simplified plan view of 1T semiconductor memory cells according to the first to third exemplary embodiments, the same reference numerals denoting identical or corresponding elements as in FIGS. 1 to 8 and repeated description being omitted below.

According to FIG. 9, the contact holes have an oval shape in respect of their plan view. They are not restricted thereto, however, and may similarly have circularly round, rectangular or other shapes. In particular, a square or trapezoidal shape is conceivable here.

Figure 10:
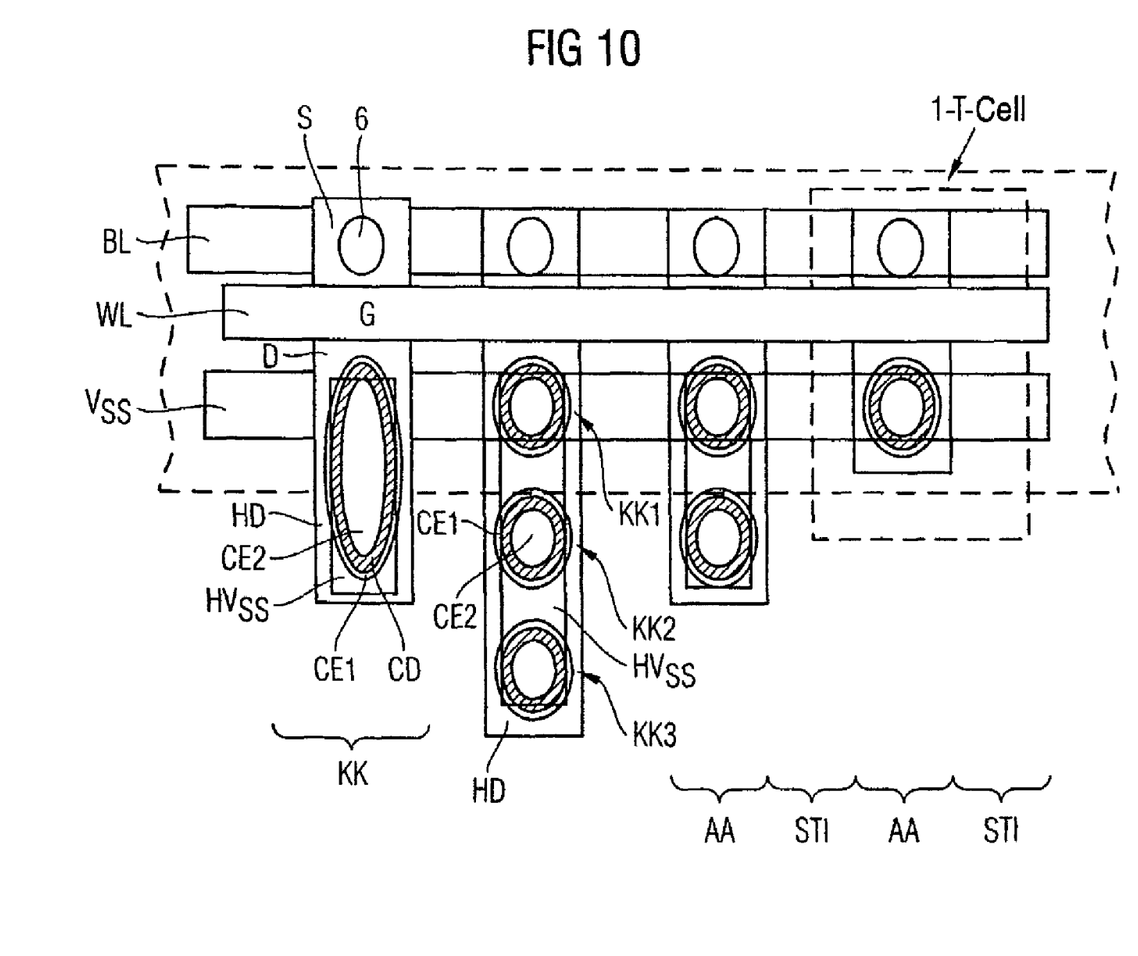
FIG. 10 shows a simplified plan view of 1T semiconductor memory cells.

FIG. 10 shows a further simplified plan view to illustrate 1-transistor semiconductor memory cells according to a fourth to sixth exemplary embodiment, the same reference numerals denoting identical or corresponding elements as in FIGS. 1 to 9 and repeated description being omitted below.

According to FIG. 10, in particular, the contact hole for freely selected adjustment of a capacitor capacitance may be greatly enlarged, the drain region D in the semiconductor substrate 1 greatly enlarging this doping region D by an auxiliary drain region HD, which is arranged for example perpendicularly to a word line WL. Similarly, an auxiliary connection line section HVSS, which allows sufficient contacting of the filler layer or filler layers 8 in the contact hole or holes, may be formed above the inter-dielectric 4. Increased capacitor capacitances are obtained due to the enlarged electrode zones. In this way, for example, refresh cycles can be substantially extended.

FIG. 10 furthermore represents a 1-transistor semiconductor memory cell with two or even three contact hole capacitors KK1, KK2 and KK3, which again lie on an enlarged auxiliary drain region HD and are again connected in parallel with one another to an auxiliary connection line section HVSS above the inter-dielectric 4.

Due to the perpendicularly formed auxiliary connection line section HVSS essentially perpendicularly to the capacitor connection line VSS or to the word line WL and the bit line BL, the three contact hole capacitors KK1 to KK3 can be connected with their respective capacitances in parallel, so that the overall capacitance for the associated 1-transistor semiconductor memory cell is correspondingly increased. Such a modular semiconductor memory cell, in which the contact hole capacitors can be modularly sequenced in predetermined capacitance sizes, furthermore has the advantage that a subsequent capacitance can also be modified retrospectively, for example by laser trimming. To this end, it is merely necessary to remove the unneeded contact hole capacitors by separating or melting through the auxiliary connection line sections.

In principle, however, differently sized or shaped contact hole capacitors may also be interconnected in the manner presented, so that modular and fine-grained adaptation of a capacitance value to respective circuit requirements can be carried out.

Figure 11:
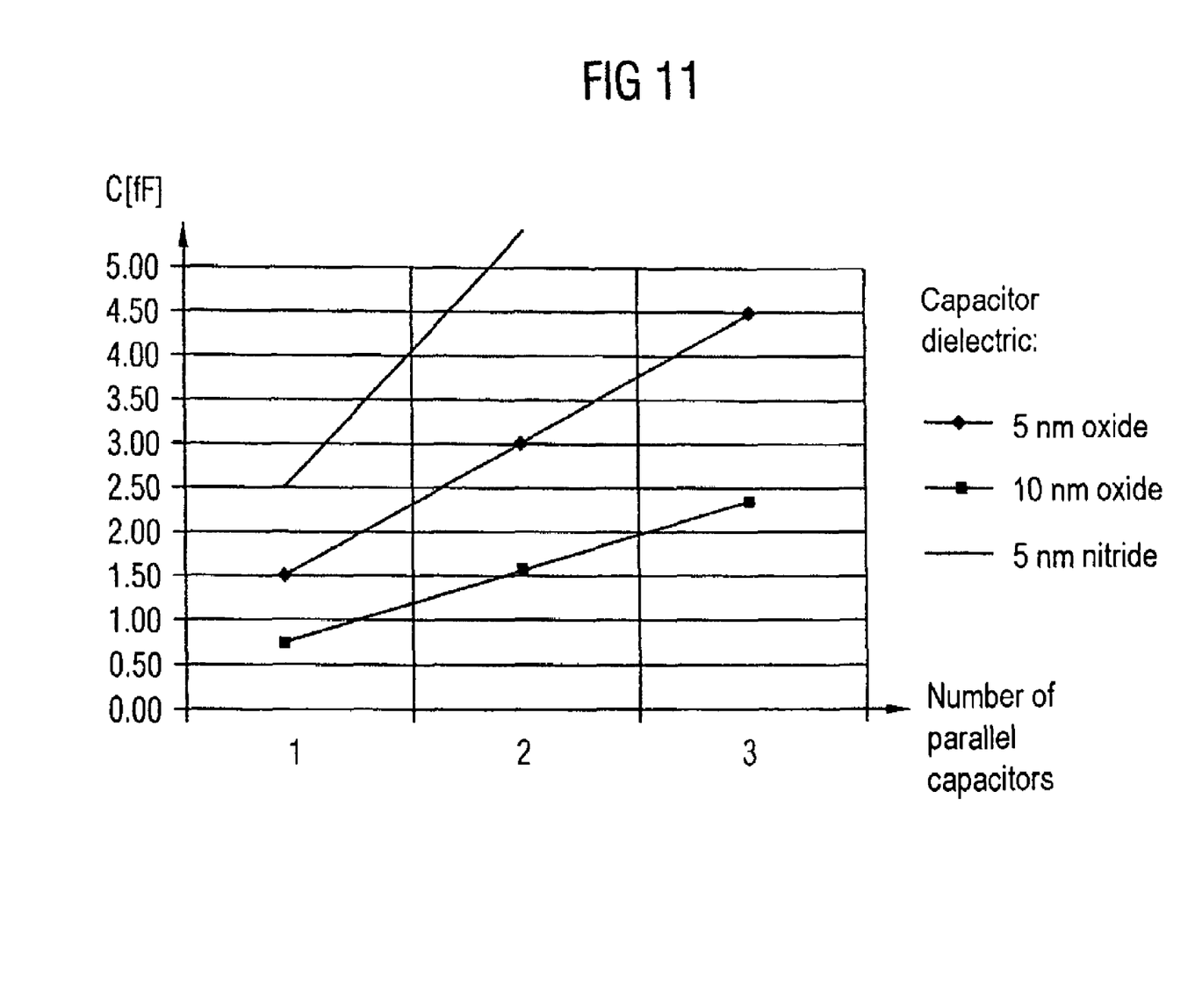
FIG. 11 shows a simplified representation to illustrate an overall capacitance as a function of a capacitor dielectric used and a number of contact hole capacitors connected in parallel.

FIG. 11 shows a simplified graphical representation to illustrate a dependence between an overall capacitance for a contact hole capacitor as a function of the capacitor dielectric used and the number of sub-capacitors connected in parallel as represented in FIG. 10.

Accordingly, very high capacitance values are obtained even for an enlarged contact hole capacitor with an approximately 5 nm thick nitride layer as the capacitor dielectric. The dependency of an overall capacitance on the number of capacitors connected in parallel could furthermore be confirmed.

The disclosure has been explained above with reference to a 1-transistor semiconductor memory cell which is formed in a silicon semiconductor substrate. It is not restricted thereto, however, and similarly covers the 2-transistor and 3-transistor semiconductor memory cells represented in FIGS. 2 and 3, as well as alternative semiconductor materials. Furthermore, the contact hole capacitor may also be formed in the contact hole for the source region S. Although the contact holes essentially have an oval shape, alternative contact hole shapes may be used similarly. Instead of the materials used in particular for the contact hole capacitor, it is furthermore possible to use alternative materials which permit a sufficiently high capacitor capacitance.

It is therefore intended that the foregoing detailed description be regarded as illustrative rather than limiting, and that it be understood that it is the following claims, including all equivalents, that are intended to define the spirit and scope of this invention.

The invention claimed is:

1. A method that produces a semiconductor memory cell having a contact hole capacitor and at least one selection transistor connected thereto, the method comprising:
   preparing a semiconductor substrate;
   forming the at least one selection transistor with a source region and a drain region to establish a channel in the semiconductor substrate, a gate stack having a gate dielectric and a control electrode formed on a surface of the channel;
   forming an inter-dielectric on a surface of the semiconductor substrate and of the gate stack;
   forming contact holes for the contact hole capacitor and a remaining source or drain region in the inter-dielectric to at least partially expose the source region and the drain region of the selection transistor;
   forming a liner layer as a capacitor counter electrode on the surface of the semiconductor substrate and of the at least one contact hole for the contact hole capacitor, the liner layer not reaching to the surface of the inter-dielectric;
   forming a further dielectric layer, which extends to the surface of the inter-dielectric, as a capacitor dielectric on the surface of the capacitor counter-electrode;
   forming an electrically conductive filler layer as a capacitor electrode on a surface of the capacitor dielectric inside the at least one contact hole for the contact hole capacitor; and
   forming a capacitor connection line on the surface of the inter-dielectric and of the filler layer to connect the capacitor electrode.

2. The method of claim 1 wherein preparing the semiconductor substrate comprises forming isolation trenches that establish active areas in the semiconductor substrate.

3. The method of claim 1 wherein forming the selection transistor comprises: forming a gate insulation layer on the surface of the semiconductor substrate; and
   forming a control electrode layer surface-wide on a surface of the gate insulation layer and structured to produce gate stacks, the source and drain regions of the selection transistor formed in a self-aligning fashion by ion implantation.

4. The method of claim 1 wherein forming the inter-dielectric comprises forming a multilayer sequence having an SiN layer and a BPSG layer.

5. The method of claim 1 wherein forming contact holes comprises simultaneously forming contact holes for the contact hole capacitor and for a remaining source or drain region.

6. The method of claim 1 wherein forming contact holes comprises forming a plurality of contact holes for the contact hole capacitor.

7. The method of claim 1 wherein forming the contact holes comprises forming circular, oval, or rectangular shaped holes in respect of plan view.

8. The method of claim 1 wherein forming the liner layer comprises simultaneously forming the liner layer in the contact hole for a remaining source or drain region.

9. The method of claim 1 wherein forming the liner layer comprises forming the liner layer surface-wide and subsequently etching back the liner layer to expose an upper contact hole zone.

10. The method of claim 1 wherein forming the liner layer comprises depositing an approximately 10 nm thick TiN layer.

11. The method of claim 1 wherein forming a further dielectric comprises:
    filling the contact hole for a remaining source or a remaining drain region with a first mask;
    depositing the further dielectric layer surface-wide;
    subsequently planarizing the further dielectric layer to a surface of the inter-dielectric; and
    removing the first mask from the contact hole for a remaining source or a remaining drain region.

12. The method of claim 1 wherein forming the further dielectric comprises:
    filling at least one contact hole for the contact hole capacitor with a first mask;
    filling the contact hole for the remaining source or drain region with a second electrically conductive filler layer;
    removing the first mask;
    forming a second mask that exposes only the at least one contact hole for the contact hole capacitor; and
    depositing the further dielectric layer surface-wide.

13. The method of claim 12 wherein forming the electrically conductive filler layer comprises:
    depositing the electrically conductive filler layer surface-wide; and
    planarizing the filler layer to the surface of the inter-dielectric.

14. The method of claim 1 comprising:
    simultaneously forming the electrically conductive filler layer and forming the capacitor connection line; and
    depositing the electrically conductive filler layer surface-wide, wherein the electrically conductive filler layer is subsequently structured to form the capacitor connection line.

15. The method of claim 6 wherein forming the capacitor connection line comprises forming an auxiliary connection line section for the plurality of contact holes.

16. The method of claim 1 wherein forming the capacitor connection line comprises simultaneously forming a bit line for a remaining source or a remaining drain region.

* * * * *